US012704626B2

(12) United States Patent
Bircumshaw et al.

(10) Patent No.: US 12,704,626 B2
(45) Date of Patent: Aug. 11, 2026

(54) INTEGRATION TECHNIQUES FOR MICROMACHINED pMUT ARRAYS AND ELECTRONICS USING SOLID LIQUID INTERDIFFUSION (SLID)

(71) Applicant: eXo Imaging, Inc., Redwood City, CA (US)

(72) Inventors: Brian Bircumshaw, Oakland, CA (US); Sandeep Akkaraju, Wellesley, MA (US)

(73) Assignee: Exo Imaging, Inc., Santa Clara, CA (US)

( * ) Notice: Subject to any disclaimer, the term of this patent is extended or adjusted under 35 U.S.C. 154(b) by 578 days.

(21) Appl. No.: 17/095,328

(22) Filed: Nov. 11, 2020

(65) Prior Publication Data

US 2021/0088655 A1 Mar. 25, 2021

Related U.S. Application Data

(63) Continuation of application No. PCT/US2019/032060, filed on May 13, 2019.
(Continued)

(51) Int. Cl.
*H10N 30/073* (2023.01)
*B06B 1/06* (2006.01)
(Continued)

(52) U.S. Cl.
CPC ........ *G01S 15/8906* (2013.01); *B06B 1/0622* (2013.01); *G01S 7/52019* (2013.01);
(Continued)

(58) Field of Classification Search
CPC ............... B06B 2201/76; B06B 1/0622; G01S 7/52019; G01S 7/52023; G01S 15/8906;
(Continued)

(56) References Cited

U.S. PATENT DOCUMENTS 4,511,052 A 4/1985 Klein et al.
5,127,410 A 7/1992 King et al.
(Continued)

FOREIGN PATENT DOCUMENTS

CN 103178204 A * 6/2013 .......... B23K 20/026
CN 106536067 A 3/2017
(Continued)

OTHER PUBLICATIONS

Tung (Au—Sn Solid-Liquid Interdiffusion (SLID) bonding for Piezoelectric Ultrasonic Transducers) (Year: 2016).*
(Continued)

*Primary Examiner* — Catherine T. Rastovski
*Assistant Examiner* — Sharad Timilsina
(74) *Attorney, Agent, or Firm* — Morgan, Lewis & Bockius LLP

(57) ABSTRACT

The present disclosure provides methods to integrate pMUT arrays with an ASIC using solid liquid interdiffusion (SLID). In an aspect, the present disclosure provides a device comprising a first substrate and a second substrate, the first substrate comprising a pMUT device and the second substrate comprising an electrical circuit, wherein the first substrate and the second substrate are bonded together using a conductive bonding pillar, which conductive bonding pillar comprises one or more intermetallic compounds. In another aspect, the present disclosure provides a device comprising a first substrate and a second substrate, the first substrate comprising a pMUT device and the second substrate comprising an electrical circuit, wherein the first substrate and the second substrate are bonded together using a conductive bonding pillar, wherein the bonding is performed at a temperature less than the melting point of the conductive bonding pillar after the bonding.

31 Claims, 12 Drawing Sheets

Related U.S. Application Data

(60) Provisional application No. 62/671,359, filed on May 14, 2018.

(51) Int. Cl.

| | |
|---|---|
| ***G01S 7/52*** | (2006.01) |
| ***G01S 15/89*** | (2006.01) |
| ***H10N 30/088*** | (2023.01) |
| ***H10N 30/80*** | (2023.01) |
| ***H10N 30/853*** | (2023.01) |
| ***H10N 30/87*** | (2023.01) |

(52) U.S. Cl.

CPC ....... *G01S 7/52023* (2013.01); *H10N 30/073* (2023.02); *H10N 30/088* (2023.02); *H10N 30/802* (2023.02); *H10N 30/8554* (2023.02); *H10N 30/875* (2023.02); *H10N 30/877* (2023.02); *B06B 2201/76* (2013.01)

(58) Field of Classification Search

CPC ............. H10N 30/8554; H10N 30/875; H10N 30/088; H10N 30/073; H10N 30/802

See application file for complete search history.

(56) References Cited

U.S. PATENT DOCUMENTS

| | | | | |
|---|---|---|---|---|
| 5,810,733 | A | 9/1998 | Van et al. | |
| 6,742,248 | B2 * | 6/2004 | Wong | H05K 3/246 174/250 |
| 6,958,255 | B2 | 10/2005 | Khuri-Yakub et al. | |
| 8,764,664 | B2 | 7/2014 | Callahan | |
| 8,988,971 | B2 | 3/2015 | Mueller et al. | |
| 9,741,682 | B2 * | 8/2017 | Arvin | B23K 35/025 |
| 9,847,310 | B2 * | 12/2017 | Seddon | H05K 3/3436 |
| 10,562,069 | B2 | 2/2020 | Horsley | |
| 11,638,571 | B2 | 5/2023 | Suzuki | |
| 2003/0160021 | A1 * | 8/2003 | Platt | B81C 1/00269 216/2 |
| 2003/0235119 | A1 | 12/2003 | Wien et al. | |
| 2007/0239001 | A1 | 10/2007 | Mehi et al. | |
| 2007/0299345 | A1 | 12/2007 | Adachi et al. | |
| 2008/0296708 | A1 | 12/2008 | Wodnicki et al. | |
| 2009/0102003 | A1 * | 4/2009 | Vogt | B81C 1/00269 257/E31.11 |
| 2009/0122651 | A1 | 5/2009 | Kupnik et al. | |
| 2010/0168583 | A1 | 7/2010 | Dausch et al. | |
| 2012/0277639 | A1 | 11/2012 | Pollock et al. | |
| 2012/0319303 | A1 * | 12/2012 | Foster | B81C 1/00269 257/E23.116 |
| 2012/0319535 | A1 | 12/2012 | Dausch | |
| 2013/0020698 | A1 * | 1/2013 | Hsieh | H10W 72/20 257/737 |
| 2013/0345567 | A1 | 12/2013 | Sudol et al. | |
| 2014/0184027 | A1 | 7/2014 | Rice et al. | |
| 2014/0187962 | A1 | 7/2014 | Reiter | |
| 2015/0061465 | A1 | 3/2015 | Lee et al. | |
| 2015/0087991 | A1 * | 3/2015 | Chen | G01S 7/52025 330/253 |
| 2015/0097468 | A1 | 4/2015 | Hajati et al. | |
| 2015/0165479 | A1 | 6/2015 | Lasiter et al. | |
| 2015/0282783 | A1 | 10/2015 | Katsura et al. | |
| 2016/0009544 | A1 * | 1/2016 | Rothberg | B81B 3/0021 257/737 |
| 2016/0187301 | A1 | 6/2016 | Gu | |
| 2017/0110504 | A1 | 4/2017 | Panchawagh | |
| 2018/0003678 | A1 | 1/2018 | Rothberg et al. | |
| 2018/0046836 | A1 | 2/2018 | Hinger | |
| 2018/0222750 | A1 * | 8/2018 | Liu | B81B 7/02 |
| 2019/0015072 | A1 | 1/2019 | Deladi et al. | |
| 2019/0178849 | A1 | 6/2019 | Abraham et al. | |
| 2021/0086231 | A1 | 3/2021 | Bircumshaw et al. | |
| 2021/0094070 | A1 | 4/2021 | Bircumshaw et al. | |
| 2021/0153844 | A1 | 5/2021 | Fredrick et al. | |

FOREIGN PATENT DOCUMENTS

| | | | |
|---|---|---|---|
| CN | 107768335 | A | 3/2018 |
| JP | 2004130138 | A | 4/2004 |
| JP | 2012133994 | A | 7/2012 |
| JP | 2017529683 | A | 10/2017 |
| JP | 2018029147 | A | 2/2018 |
| KR | 20160018235 | A | 2/2016 |
| KR | 20170030605 | A | 3/2017 |
| KR | 20170067632 | A | 6/2017 |
| WO | WO-2008137030 | A1 | 11/2008 |
| WO | WO-2016011000 | A1 | 1/2016 |
| WO | WO2017066612 | A1 | 4/2017 |
| WO | WO-2017143307 | A1 | 8/2017 |
| WO | WO-2019222116 | A1 | 11/2019 |
| WO | WO-2019222118 | A1 | 11/2019 |
| WO | WO-2020198257 | A1 | 10/2020 |
| WO | WO-2021102127 | A1 | 5/2021 |

OTHER PUBLICATIONS

SLID (Year: 2016).*

Tung et al. (Au—Sn Solid-Liquid Interdiffusion (SLID) bonding for Piezoelectric Ultrasonic Transducers) 2016 IEEE International Ultrasonics Symposium, 2016. Herein after Tung. (Year: 2016).*

Au—Sn Slid bonding (Year: 2016).*

PCT/US2022/021556 International Search Report and Written Opinion dated Jul. 22, 2022.

PCT/US2022/021556 Invitation to Pay Additional Fees dated May 26, 2022.

PCT/US2020/061261 International Search Report and Written Opinion dated Feb. 9, 2021.

PCT/US2021/056026 International Search Report and Written Opinion dated Jan. 28, 2022.

PCT/US2021/056669 International Search Report and Written Opinion dated Jan. 28, 2022.

Mahn et al. Au—Sn solid-liquid interdiffusion (SLID) bonding for piezoelectric ultrasonic transducers. 2016 IEEE International Ultrasonics Symposium (IUS) Tours (pp. 1-4)(2016).

PCT/US2019/032060 International Search Report and Written Opinion dated Jul. 26, 2019.

PCT/US2019/032062 International Search Report and Written Opinion dated Jul. 29, 2019.

PCT/US2022/012126 International Search Report and Written Opinion dated Apr. 1, 2022.

* cited by examiner

INTEGRATION TECHNIQUES FOR MICROMACHINED pMUT ARRAYS AND ELECTRONICS USING SOLID LIQUID INTERDIFFUSION (SLID)

CROSS-REFERENCE

This application is a continuation of PCT/US2019/032060, filed May 13, 2019, which claims the benefit of U.S. Provisional Application No. 62/671,359, filed May 14, 2018, which are incorporated by reference in their entirety.

BACKGROUND

Piezoelectric micromachined ultrasonic transducer (pMUT) arrays may offer advantages in ultrasonic imaging due to their efficiency in transducing between the electrical and acoustic energy domains. In particular, pMUTs may offer the key advantage of imaging with ≤10V drive, thereby enabling direct coupling to modern electronic nodes without intermediary electronics. By eliminating high voltage drivers and coupling the circuitry directly to the pMUT arrays, several advantages can be realized, such as reduction of costly and bulky wiring, decreased noise, and reduced overall system cost, power, and/or size.

SUMMARY

The present disclosure provides methods to integrate pMUT arrays with an application-specific integrated circuit (ASIC) using solid liquid interdiffusion (SLID). In some embodiments, the SLID comprises Cu—Sn SLID. Alternatively, other systems may also be viable, including but not limited to gold-tin (Au—Sn), gold-indium (Au—In), gold-indium-nickel (Au—In—Ni), and nickel-tin (Ni—Sn) systems. SLID generally refers to a process in which two metals are brought into contact, of which one metal has a higher melting point (e.g., Au, Cu, Ni, Ag) and the other metal has a lower melting temperature (e.g., Sn or In). The system comprising two metals is brought to a temperature above the melting temperature of the lower melting point metal, $M_L$. The higher melting point metal, $M_H$, may diffuse into the liquid $M_L$, thereby forming intermetallic compounds (IMCs) based on the temperature and phase diagram of the system. The IMCs will continue to form until the IMCs have a higher temperature than the bonding temperature of the system, at which point, the material may cease reacting and solidify.

SLID may offer several advantages for integration, including heterogeneous integration, low temperature, low resistance, high-density, high-yield interconnect, high-temperature stability, superior bond performance, wafer-to-wafer, die-to-wafer, or die-to-die bonding, overcoming high coefficient of thermal expansion (CTE) mismatches in substrates, and environmental control between parts.

In an aspect, the present disclosure provides a device comprising a first substrate and a second substrate, the first substrate comprising at least one piezoelectric micromachined ultrasonic transducer (pMUT) device and the second substrate comprising at least one electrical circuit, wherein the first substrate and the second substrate are bonded together using a conductive bonding pillar, which conductive bonding pillar comprises one or more intermetallic compounds.

In some embodiments, the pMUT device is configured to perform ultrasound imaging. In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using solid liquid interdiffusion (SLID). In some embodiments, the bonding comprises die-to-die bonding. In some embodiments, the bonding comprises solid liquid interdiffusion (SLID), and wherein the bonding forms a hermetic sealed cavity, which cavity is configured to controllably maintain gas species and pressure. In some embodiments, the conductive bonding pillar has a height of at least about 5 μm. In some embodiments, the conductive bonding pillar has a lateral dimension between 10 μm and 100 μm. In some embodiments, the at least one electrical circuit comprises an application-specific integrated circuit (ASIC). In some embodiments, the bonding comprises solid liquid interdiffusion (SLID) bonding, wherein the SLID bonding is performed at a temperature of no more than about 350° C. In some embodiments, the SLID bonding is performed at a temperature of no more than about 300° C. In some embodiments, the SLID bonding comprises bonding together a plurality of different metals selected from the group consisting of silver (Ag), gold (Au), copper (Cu), indium (In), nickel (Ni), and tin (Sn). In some embodiments, the plurality of different metals comprises Cu—Sn, Au—Sn, Au—In, Au—In—Ni, or Ni—Sn.

In another aspect, the present disclosure provides a device comprising a first substrate and a second substrate, the first substrate comprising at least one piezoelectric micromachined ultrasonic transducer (pMUT) device and the second substrate comprising at least one electrical circuit, wherein the first substrate and the second substrate are bonded together using a conductive bonding pillar, wherein the bonding is performed at a temperature less than the melting point of the conductive bonding pillar after the bonding.

In some embodiments, the pMUT device is configured to perform ultrasound imaging. In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using solid liquid interdiffusion (SLID). In some embodiments, the bonding comprises die-to-die bonding. In some embodiments, the bonding comprises solid liquid interdiffusion (SLID), and wherein the bonding forms a hermetic sealed cavity, which cavity is configured to controllably maintain gas species and pressure. In some embodiments, the conductive bonding pillar has a height of at least about 5 μm. In some embodiments, the conductive bonding pillar has a lateral dimension between 10 μm and 100 μm. In some embodiments, the at least one electrical circuit comprises an application-specific integrated circuit (ASIC). In some embodiments, the bonding comprises solid liquid interdiffusion (SLID) bonding, wherein the SLID bonding is performed at a temperature of no more than about 350° C. In some embodiments, the SLID bonding is performed at a temperature of no more than about 300° C. In some embodiments, the SLID bonding comprises bonding together a plurality of different metals selected from the group consisting of silver (Ag), gold (Au), copper (Cu), indium (In), nickel (Ni), and tin (Sn). In some embodiments, the plurality of different metals comprises Cu—Sn, Au—Sn, Au—In, Au—In—Ni, or Ni—Sn.

In another aspect, the present disclosure provides a method of fabricating an integrated device, the method comprising: (a) obtaining a first substrate comprising at least one piezoelectric micromachined ultrasonic transducer (pMUT) device; (b) obtaining a second substrate comprising at least one electrical circuit; and (c) bonding together the first substrate and the second substrate using a conductive bonding pillar, which conductive bonding pillar comprises one or more intermetallic compounds.

In some embodiments, the pMUT device is configured to perform ultrasound imaging. In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using solid liquid interdiffusion (SLID). In some embodiments, the bonding comprises die-to-die bonding. In some embodiments, the bonding comprises solid liquid interdiffusion (SLID), and wherein the bonding forms a hermetic sealed cavity, which cavity is configured to controllably maintain gas species and pressure. In some embodiments, the conductive bonding pillar has a height of at least about 5 μm. In some embodiments, the conductive bonding pillar has a lateral dimension between 10 μm and 100 μm. In some embodiments, the at least one electrical circuit comprises an application-specific integrated circuit (ASIC). In some embodiments, the bonding comprises solid liquid interdiffusion (SLID) bonding, wherein the SLID bonding is performed at a temperature of no more than about 350° C. In some embodiments, the SLID bonding is performed at a temperature of no more than about 300° C. In some embodiments, the SLID bonding comprises bonding together a plurality of different metals selected from the group consisting of silver (Ag), gold (Au), copper (Cu), indium (In), nickel (Ni), and tin (Sn). In some embodiments, the plurality of different metals comprises Cu—Sn, Au—Sn, Au—In, Au—In—Ni, or Ni—Sn.

In another aspect, the present disclosure provides a method of fabricating an integrated device, the method comprising: (a) obtaining a first substrate comprising at least one piezoelectric micromachined ultrasonic transducer (pMUT) device; (b) obtaining a second substrate comprising at least one electrical circuit; and (c) bonding together the first substrate and the second substrate using a conductive bonding pillar, wherein the bonding is performed at a temperature less than the melting point of the conductive bonding pillar after the bonding.

In some embodiments, the pMUT device is configured to perform ultrasound imaging. In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using solid liquid interdiffusion (SLID). In some embodiments, the bonding comprises die-to-die bonding. In some embodiments, the bonding comprises solid liquid interdiffusion (SLID), and wherein the bonding forms a hermetic sealed cavity, which cavity is configured to controllably maintain gas species and pressure. In some embodiments, the conductive bonding pillar has a height of at least about 5 μm. In some embodiments, the conductive bonding pillar has a lateral dimension between 10 μm and 100 μm. In some embodiments, the at least one electrical circuit comprises an application-specific integrated circuit (ASIC). In some embodiments, the bonding comprises solid liquid interdiffusion (SLID) bonding, wherein the SLID bonding is performed at a temperature of no more than about 350° C. In some embodiments, the SLID bonding is performed at a temperature of no more than about 300° C. In some embodiments, the SLID bonding comprises bonding together a plurality of different metals selected from the group consisting of silver (Ag), gold (Au), copper (Cu), indium (In), nickel (Ni), and tin (Sn). In some embodiments, the plurality of different metals comprises Cu—Sn, Au—Sn, Au—In, Au—In—Ni, or Ni—Sn.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIG. 1 illustrates an end result of a pMUT array conductively bonded to an ASIC using a SLID process, in accordance with disclosed embodiments.

DETAILED DESCRIPTION

Figures 2A, 2B, 2C:
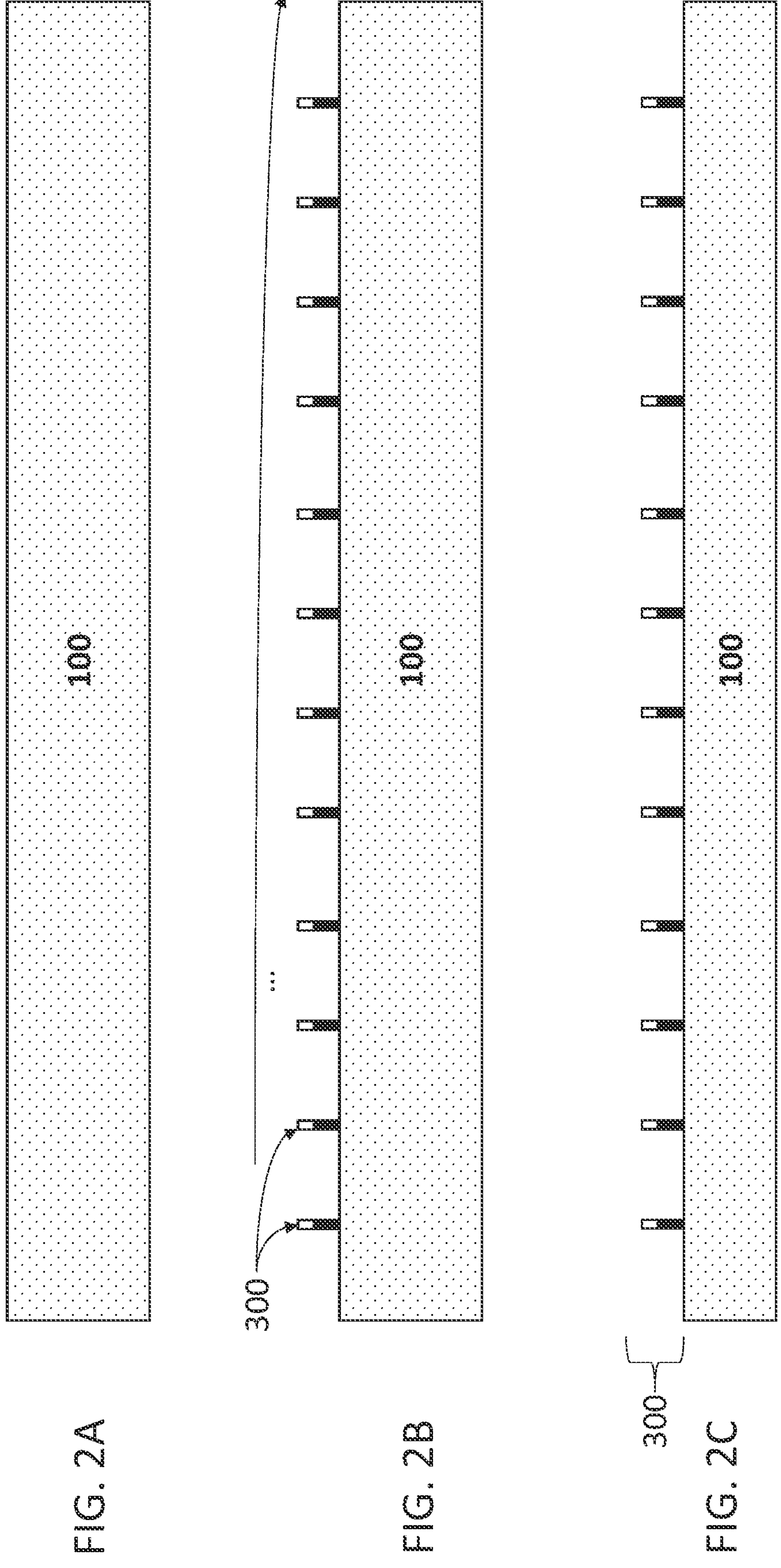
FIGS. 2A, 2B, and 2C illustrate an ASIC preparation for SLID bonding, in accordance with disclosed embodiments.

Piezoelectric micromachined ultrasonic transducer (pMUT) arrays may offer advantages in ultrasonic imaging due to their efficiency in transducing between the electrical and acoustic energy domains. In particular, pMUTs may offer the key advantage of imaging with ≤10V drive, thereby enabling direct coupling to modern electronic nodes without intermediary electronics. By eliminating high voltage drivers and coupling the circuitry directly to the pMUT arrays, several advantages can be realized, such as reduction of costly and bulky wiring, decreased noise, and reduced overall system cost, power, and/or size.

The present disclosure provides methods to integrate piezoelectric micromachined ultrasonic transducer (pMUT) arrays with an application-specific integrated circuit (ASIC) using solid liquid interdiffusion (SLID). In some embodiments, the SLID comprises Cu—Sn SLID. Alternatively, other systems may also be viable, including but not limited to gold-tin (Au—Sn), gold-indium (Au—In), gold-indium-nickel (Au—In—Ni), and nickel-tin (Ni—Sn) systems. SLID generally refers to a process in which two metals are brought into contact, of which one metal has a higher melting point (e.g., Au, Cu, Ni, Ag) and the other metal has a lower melting temperature (e.g., Sn or In). The system comprising two metals may be brought to a temperature above the melting temperature of the lower melting point metal, $M_L$. The higher melting point metal, $M_H$, may diffuse into the liquid $M_L$, thereby forming intermetallic compounds (IMCs) based on the temperature and phase diagram of the system. The IMCs may continue to form until the IMCs have a higher temperature than the bonding temperature of the system, at which point, the material will then cease reacting and solidify.

The use of SLID to perform integration of micromachined pMUT arrays and electronics may offer several advantages for integration, including heterogeneous integration, low temperature, low resistance, high-density, high-yield interconnect, high-temperature stability, superior bond performance, wafer-to-wafer, die-to-wafer, or die-to-die bonding, overcoming high coefficient of thermal expansion (CTE) mismatches in substrates, and environmental control between parts.

For example, the use of SLID to perform integration of micromachined pMUT arrays and electronics may enable heterogeneous integration by the bonding and interconnecting of two separate dice fabricated using different process techniques. Using methods of the present disclosure, a variety of electronics may be integrated with microelectromechanical systems (MEMS) components.

As another example, the use of SLID to perform integration of micromachined pMUT arrays and electronics may be performed at low temperature. For example, the Cu—Sn SLID bonding process can be performed at a temperature of about 300° C., which is below the Curie temperature (Tc) of some lead zirconate titanate ($Pb[Zr_xTi_{1-x}]O_3$) materials (PZTs), which generally have Tc values in a range between 200° C. and 400° C. In particular, performing integration of pMUT arrays and electronics at low temperature may advantageously preserve reliability of the pMUT arrays.

As another example, the use of SLID to perform integration of micromachined pMUT arrays and electronics may offer low resistance. To reduce noise and parasitics, an interconnection method may be chosen with a low resistance of no more than about 1 ohm (Ω). SLID typically utilizes metals, thereby producing integrated structures with interconnect resistances of much lower than 1 ohm (Ω).

As another example, the use of SLID to perform integration of micromachined pMUT arrays and electronics may offer high-density, high-yield interconnects. SLID may support interconnect pitches of less than 100 microns (μm) and hence enables interconnection of a dense array of devices with electronics, which may be necessary, e.g., to fabricate transducer arrays configured for ultrasound imaging. The density of an interconnect may be primarily regulated by the control of the interconnect height based on plating. The yield of an interconnect may be similarly limited by the interconnect height control of the plating. If this interconnect height is controlled, then the yield of the interconnect may be dominated by the defect density.

As another example, the use of SLID to perform integration of micromachined pMUT arrays and electronics may offer high-temperature stability. SLID bonding of two metals may include controlling an amount of one of the two metals, such that the SLID process can be forced to an endpoint beyond which further thermal excursions will not affect the bond. For example, in the case of Cu—Sn SLID bonding, the Sn thickness can be controlled in order to control the reaction. Once the entire volume of Sn is consumed into the intermetallic compounds (IMCs), the IMCs and the remaining Cu ($M_H$) are stable up to the bonding temperature. Therefore, the resulting bond can be subjected to multiple temperature excursions up to the bonding temperature without substantively changing the bond. In particular, SLID bonding may advantageously avoid a drawback of other methods of bonding, such as eutectic bonds, which may frequently leave unreacted materials such that subsequent temperature excursions result in changes in the bond.

As another example, the use of SLID to perform integration of micromachined pMUT arrays and electronics may offer superior bond performance. Because the SLID bond is based on metals, the bond may have a high strength and may be capable of a hermetic seal.

As another example, the use of SLID to perform integration of micromachined pMUT arrays and electronics may enable different bonding types, including wafer-to-wafer, die-to-wafer, and die-to-die bonding. For example, wafer-to-wafer SLID bonding may be performed with higher throughput and lower cost, while die-to-wafer SLID bonding or die-to-die SLID bonding may be performed to enable the bonding of only known good dice for higher yield.

As another example, the use of SLID to perform integration of micromachined pMUT arrays and electronics may avoid challenges associated with a high coefficient of thermal expansion (CTE). Such high CTEs may often cause mismatches in substrates. For example, methods of integration using SLID bonding may use die-to-wafer and/or die-to-die bonding, thereby overcoming substantial CTE mismatches, which may be a common challenge with integration of modern ASICs with many metal layers encased in oxide. For example, such CTE mismatches can cause alignment errors during bonding and excessive stress of the interconnect after bonding.

As another example, the use of SLID to perform integration of micromachined pMUT arrays and electronics may enable environmental control between parts. For example, SLID bonding may enable the formation of closed cavities in which the cavity environment can be controlled in terms of gas species and pressure. For example, the gas species and pressure can be tuned for optimal imager performance.

Figure 1:
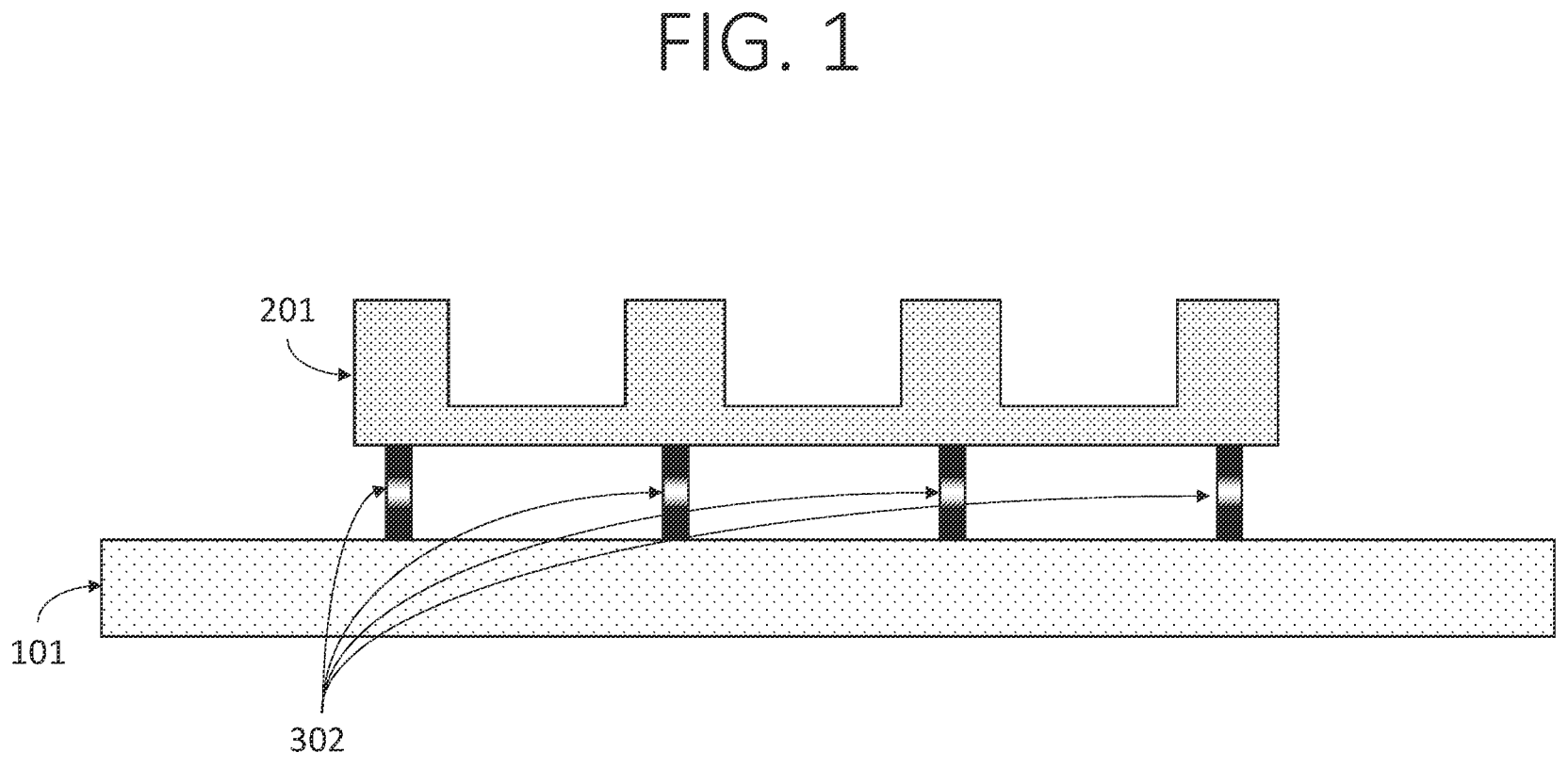

FIG. 1 illustrates an end result of a pMUT array conductively bonded to an ASIC using a SLID process, in accordance with disclosed embodiments. By performing methods of the present disclosure, a pMUT (piezoelectric micromachined ultrasonic transducer) array can be bonded with an ASIC (application-specific integrated circuit) using SLID to form a dense array of conductive bonds, in accordance with various embodiments. In some embodiments, the bonding may comprise wafer-to-wafer bonding using SLID. In some embodiments, the bonding may comprise die-to-wafer bonding using SLID. In some embodiments, the bonding may comprise diced wafer-to-wafer bonding using SLID. In some embodiments, the bonding may comprise die-to-die bonding using SLID. As shown in FIG. 1, the end result of the bonding process may have a pMUT die (201) that is bonded to an ASIC die (101) using a set of one or more conductive bonds (302).

In an aspect, a method of fabricating an integrated device may comprise obtaining a first substrate comprising at least one piezoelectric micromachined ultrasonic transducer (pMUT) device. The pMUT device may be configured to perform ultrasound imaging (e.g., using one or more pMUT transducer arrays). The method of fabricating an integrated device may comprise obtaining a second substrate comprising at least one electrical circuit. The electrical circuit may comprise an application-specific integrated circuit (ASIC). The method of fabricating an integrated device may comprise bonding together the first substrate and the second substrate using a conductive bonding pillar. The conductive bonding pillar may comprise one or more intermetallic compounds.

In another aspect, a method of fabricating an integrated device may comprise obtaining a first substrate comprising at least one piezoelectric micromachined ultrasonic transducer (pMUT) device. The pMUT device may be configured to perform ultrasound imaging (e.g., using one or more pMUT transducer arrays). The method of fabricating an integrated device may comprise obtaining a second substrate comprising at least one electrical circuit. The electrical circuit may comprise an application-specific integrated circuit (ASIC). The method of fabricating an integrated device may comprise bonding together the first substrate and the second substrate using a conductive bonding pillar. The bonding may be performed at a temperature less than the melting point of the conductive bonding pillar after the bonding.

The conductive bonding pillar may have a height of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10 μm, at least about 5 μm, at least about 4 μm, at least about 3 μm, at least about 2 μm, or at least about 1 μm. The conductive bonding pillar may have a lateral dimension between about 10 μm and about 100 μm. For example, the conductive bonding pillar may have a lateral dimension of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10 μm, at least about 5 μm, at least about 4 μm, at least about 3 μm, at least about 2 μm, or at least about 1 μm.

The conductive receiver pad or pillar may have a height of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10 μm, at least about 5 μm, at least about 4 μm, at least about 3 μm, at least about 2 μm, or at least about 1 μm. The conductive receiver pad or pillar may have a lateral dimension between about 10 μm and about 100 μm. For example, the conductive receiver pad or pillar may have a lateral dimension of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10 μm, at least about 5 μm, at least about 4 μm, at least about 3 μm, at least about 2 μm, or at least about 1 μm.

The bonding may comprise solid liquid interdiffusion (SLID) bonding. The SLID bonding may be performed at a temperature of no more than about 400° C., no more than about 390° C., no more than about 380° C., no more than about 370° C., no more than about 360° C., no more than about 350° C., no more than about 340° C., no more than about 330° C., no more than about 320° C., no more than about 310° C., no more than about 300° C., no more than about 290° C., no more than about 280° C., no more than about 270° C., no more than about 260° C., no more than about 250° C., no more than about 240° C., no more than about 230° C., no more than about 220° C., no more than about 210° C., or no more than about 200° C.

In some embodiments, the SLID bonding comprises bonding together a plurality of (e.g., 2 or 3) different metals selected from the group consisting of silver (Ag), gold (Au), copper (Cu), indium (In), nickel (Ni), and tin (Sn). For example, the plurality of different metals may comprise Cu—Sn, Au—Sn, Au—In, Au—In—Ni, or Ni—Sn.

Wafer-to-Wafer Bonding Using SLID

In an embodiment, the bonding may comprise a method for wafer-to-wafer bonding using SLID. FIGS. 2A, 2B, and 2C illustrate an ASIC wafer preparation for SLID bonding, in accordance with disclosed embodiments. As illustrated in the cross-section views from FIGS. 2A to 2B, a set of one or more conductive bond pillars (300) are deposited and patterned on an ASIC wafer (100) or plated using a mold such as a photo-definable resist ("photoresist"). The conductive bond pillars may be formed by the low-melting temperature metal, $M_L$ (e.g., Sn or In), on top of the high-melting temperature metal, $M_H$ (e.g., Cu, Au, Ag, or Ni). Generally, $M_H$ may be chosen to be thicker than $M_L$, although the bond pillars can have any suitable height and array configuration. After the conductive bond pillars are formed, the ASIC substrate can be thinned as needed, as illustrated in the cross-section views from FIGS. 2B to 2C. For example, a backside thinning process may be used to thin the backside of the ASIC wafer (100) to a desired thickness.

Figures 3A, 3B, 3C:
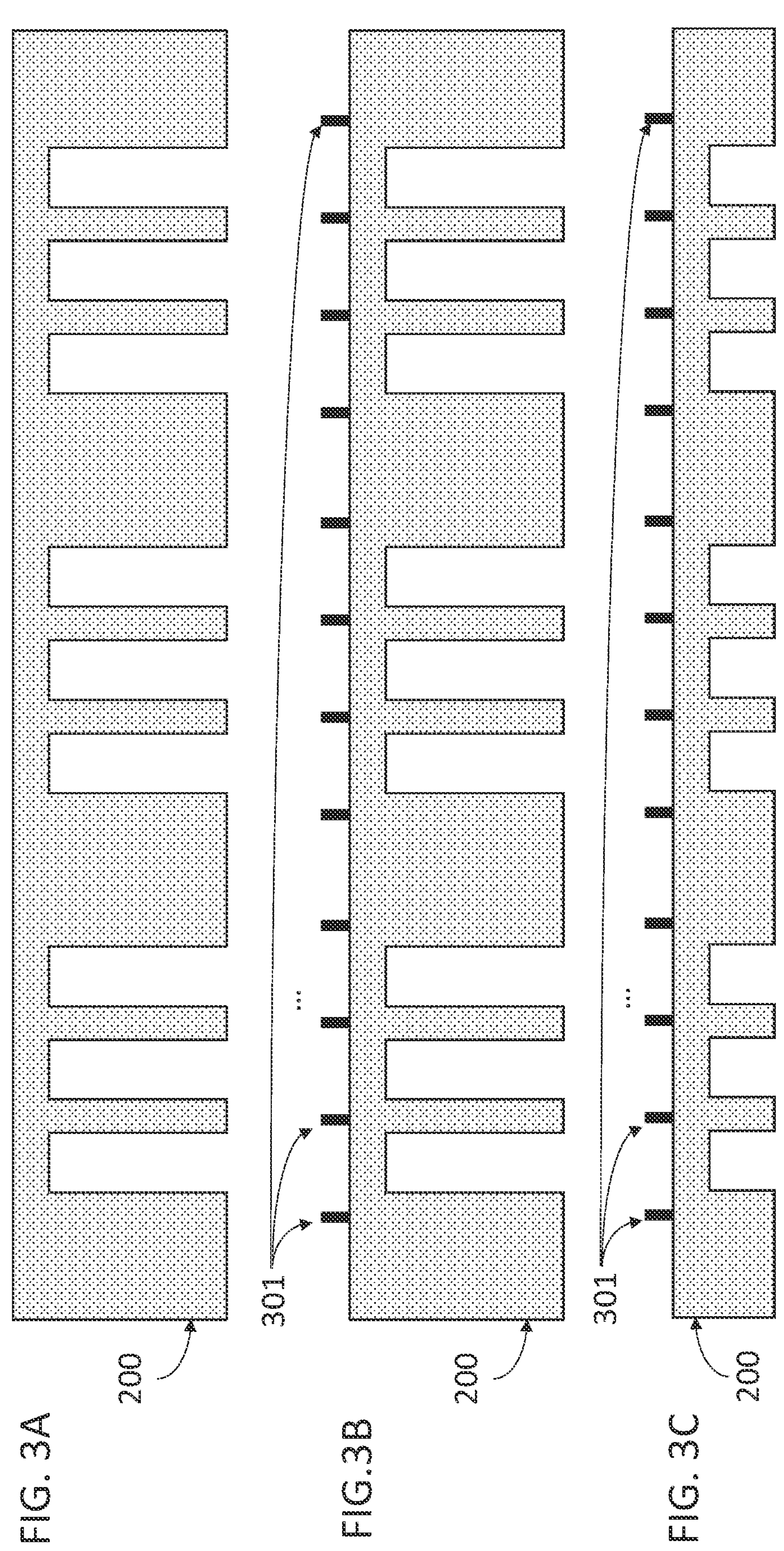
FIGS. 3A, 3B, and 3C illustrate a pMUT array wafer preparation for SLID bonding, in accordance with disclosed embodiments.

FIGS. 3A, 3B, and 3C illustrate a pMUT array wafer preparation for SLID bonding, in accordance with disclosed embodiments. As illustrated in the cross-section views from FIGS. 3A to 3B, a set of one or more conductive receiver pads or pillars (301) are deposited and patterned on a pMUT wafer (200) or plated using a mold such as a photo resist. The conductive receiver pads or pillars (301) can have any suitable height and array configuration. The conductive receiver pads or pillars (301) can be formed at the time the pMUT wafer is fabricated. After the conductive receiver pads or pillars (301) are formed, the substrate can be thinned as needed, as illustrated in the cross-section views from FIGS. 3B to 3C. For example, a backside thinning process may be used to thin the backside of the pMUT wafer (200) to a desired thickness. The conductive receiver pads or pillars (301) may be formed only by the high-melting temperature metal, $M_H$ (e.g., Cu, Au, Ag, or Ni). Alternatively, the conductive receiver pads or pillars (301) may be formed by the high melting metal, $M_H$, capped by the low melting temperature metal, $M_L$ (e.g., Sn or In). In some embodiments, the conductive receiver pads or pillars (301) may be formed from only the low melting temperature metal, $M_L$.

Figures 4A, 4B:
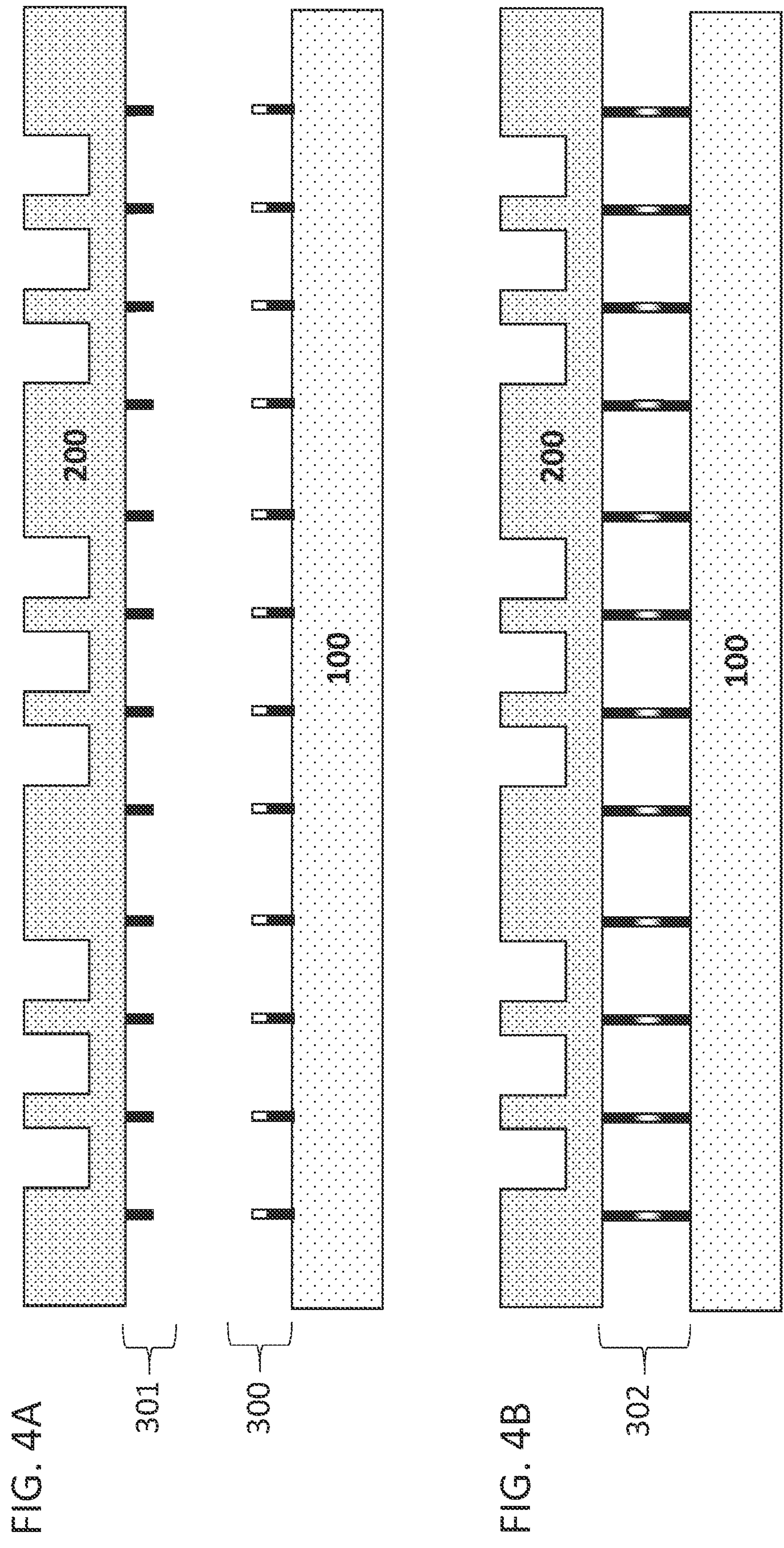
FIGS. 4A and 4B illustrate a SLID wafer to wafer bonding of a pMUT array and an ASIC, in accordance with disclosed embodiments.

FIGS. 4A and 4B illustrate a SLID wafer-to-wafer bonding of a pMUT array and an ASIC, in accordance with disclosed embodiments. After forming the conductive bond pillars on the ASIC wafer and forming the conductive receiver pillars or pads on the pMUT wafer, as illustrated in the cross-section views in FIGS. 4A and 4B, the pMUT wafer (200) is inverted and aligned to the ASIC wafer (100), or vice versa. The two wafers are aligned together, the fabrication atmosphere conditions (e.g., gases, temperature, and/or pressure) are adjusted as necessary, and the wafers are brought into contact. To form a sufficient intimate contact to promote bonding, pressure is applied to the contacting wafers. The wafers are brought up to a temperature suitable for the conductive bond pillars (300) and the conductive receiver pads or pillars (301) to form solid conductive bonds (300) using the SLID process, as illustrated in the cross-section views from FIGS. 4A and 4B. After the solid conductive bonds are formed between the two wafers, the wafer stack can be further processed as needed. For example, the pMUT dice (201) can be further thinned if desired.

Figures 5A, 5B:
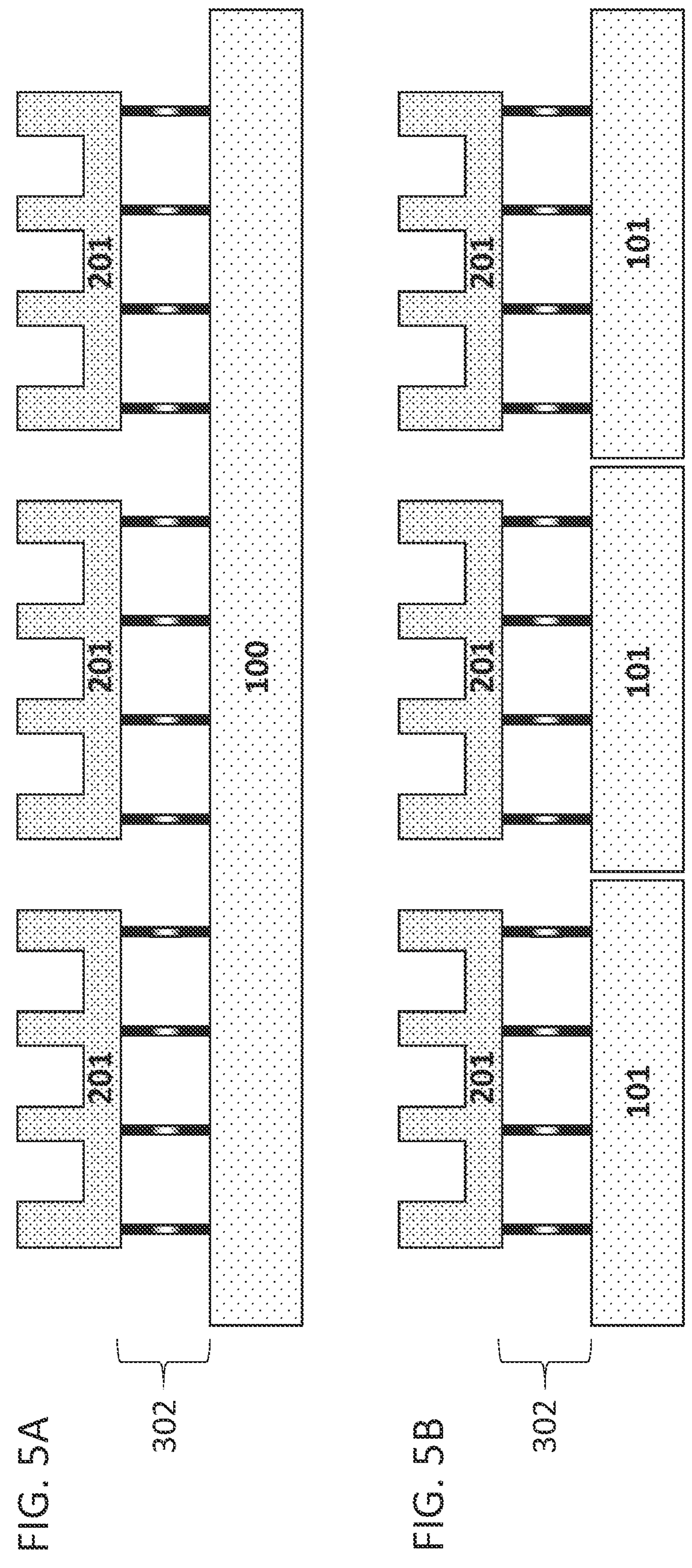
FIGS. 5A and 5B illustrate a singulation of pMUT and ASIC wafers, in accordance with disclosed embodiments.

FIGS. 5A and 5B illustrate a singulation of pMUT and ASIC wafers, in accordance with disclosed embodiments. After the solid conductive bonds are formed between the two wafers, the wafers are singulated, one after the other. Singulation may comprise dicing a wafer to produce individual sections or pieces. As an example, FIG. 5A illustrates the pMUT wafer (200) from FIG. 4B after being singulated to produce a plurality of pMUT dice (201). Then, the ASIC wafer (100) is singulated from FIGS. 5A to 5B to produce a plurality of ASIC dice (101), thereby completing the method for wafer-to-wafer bonding and obtaining the desired bonded configuration illustrated in FIG. 1. Alternatively, the ASIC wafer may be singulated to produce a plurality of ASIC dice (101), and then the pMUT wafer may be singulated to produce a plurality of pMUT dice (201), thereby completing the method for wafer-to-wafer bonding and obtaining the desired bonded configuration illustrated in FIG. 1.

It will be appreciated that one of skill in the art can use alternatives to the metal configurations for the bond. For example, $M_H$ and $M_L$ may be applied to the pMUT wafer (200), and/or only $M_H$ may be applied to the ASIC wafer (100). Further, the specific thicknesses of $M_H$ and $M_L$ can be adjusted, as long as the SLID process for the specific metal system is allowed to reach equilibrium with the available metal volumes. Because $M_L$ may be liquefied, its thickness can be adjusted to overcome any variations in height from the pillars and/or the wafers.

The method for wafer-to-wafer bonding using SLID may present advantages of offering the ability to rapidly bond a large number of components, while minimizing extra processing steps. Such manufacturing advantages can be critical for high volume and/or low cost. The method for wafer-to-wafer bonding process may also present potential challenges, such as 1) compounding of ASIC and pMUT yields, 2) alignment errors in the substrates due to CTE mismatches, and 3) a need for the ASIC and pMUT wafers to be designed to match each another exactly.

Die-to-Wafer Bonding Using SLID

Figures 6A, 6B, 6C:
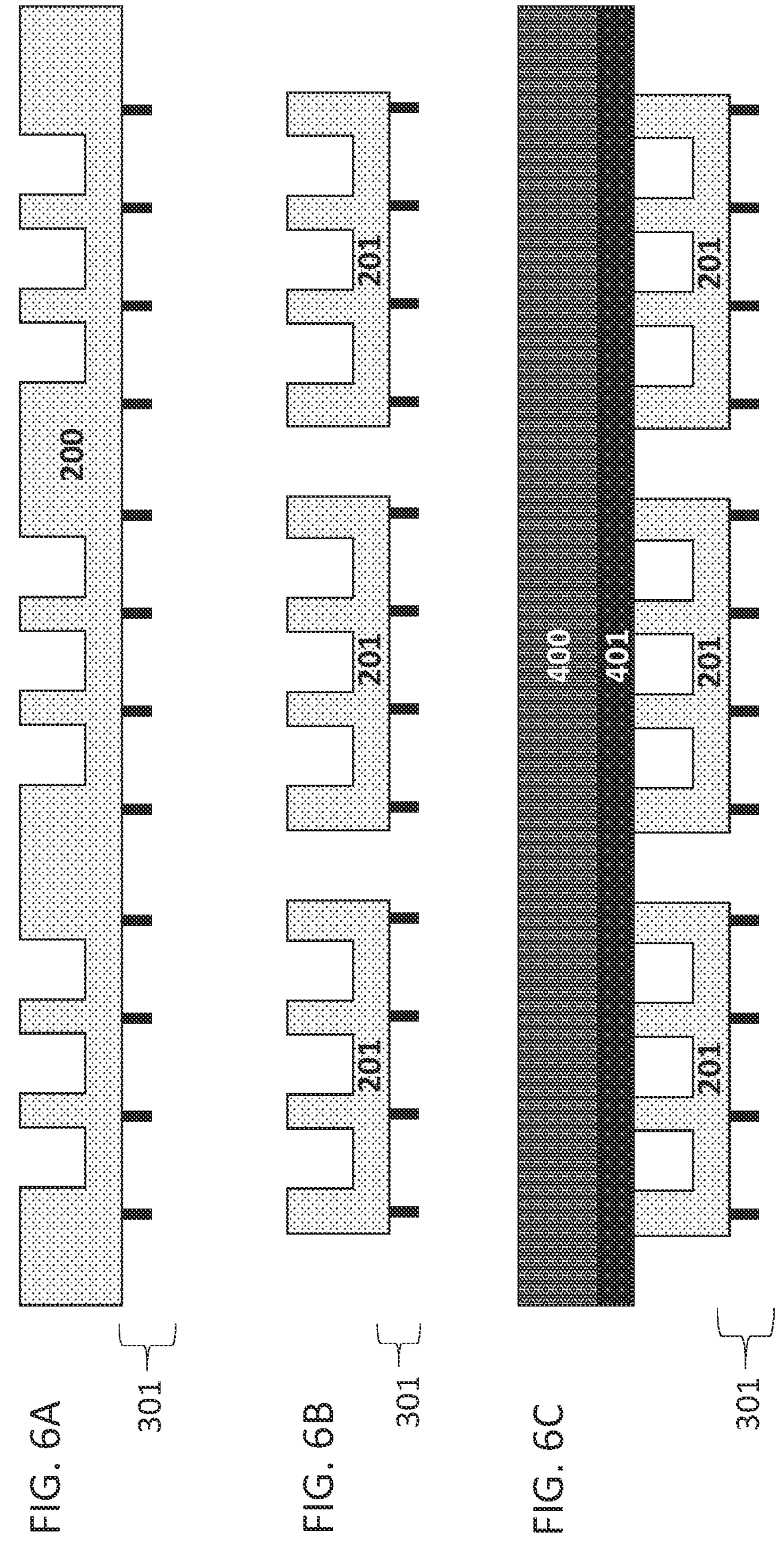
FIGS. 6A, 6B, and 6C illustrate preparation, singulation, and mounting of pMUT arrays to a handle substrate, in accordance with disclosed embodiments.

In an embodiment, the bonding may comprise a method for die-to-wafer bonding using SLID. The method for die-to-wafer bonding may comprise bonding a plurality of pMUT dice (201) to a single ASIC wafer (100) using the SLID process. Alternatively, the method for die-to-wafer bonding may comprise bonding a plurality of ASIC dice to a single pMUT wafer using the SLID process. FIGS. 6A, 6B, and 6C illustrate preparation, singulation, and mounting of pMUT arrays to a handle substrate, in accordance with disclosed embodiments. For example, the pMUT wafer (200) from FIG. 3C may be singulated, as illustrated in the cross-section views from FIGS. 6A to 6B, to produce a plurality of individual pMUT dice (201). The plurality of individual pMUT dice (201) may be arranged on a handle substrate (400) with a temporary bonding layer (401), as illustrated in FIG. 6C. The arrangement may mirror that of the ASIC dice (101) on the ASIC wafer (100).

The method for die-to-wafer bonding using SLID may comprise preparing the ASIC wafer (100) as described in FIGS. 2A, 2B, and 2C. A set of one or more conductive bond pillars (300) may be deposited and patterned on the ASIC wafer (100) or plated using a mold such as a photoresist. After the conductive bond pillars are formed, the ASIC substrate can be thinned as needed. The ASIC wafer (100) and the plurality of pMUT dice (201) with handle substrate (400) and temporary bonding layer (401) are aligned together, the fabrication atmosphere conditions (e.g., gases, temperature, and/or pressure) are adjusted as necessary, and the wafers are brought into contact. To form a sufficient intimate contact to promote bonding, pressure is applied to the contacting wafers. The wafers are brought up to a temperature suitable for the conductive bond pillars (300) and the conductive receiver pads or pillars (301) to form solid conductive bonds (300) using the SLID process, as illustrated in the cross-section views from FIGS. 7A and 7B.

Figures 7A, 7B:
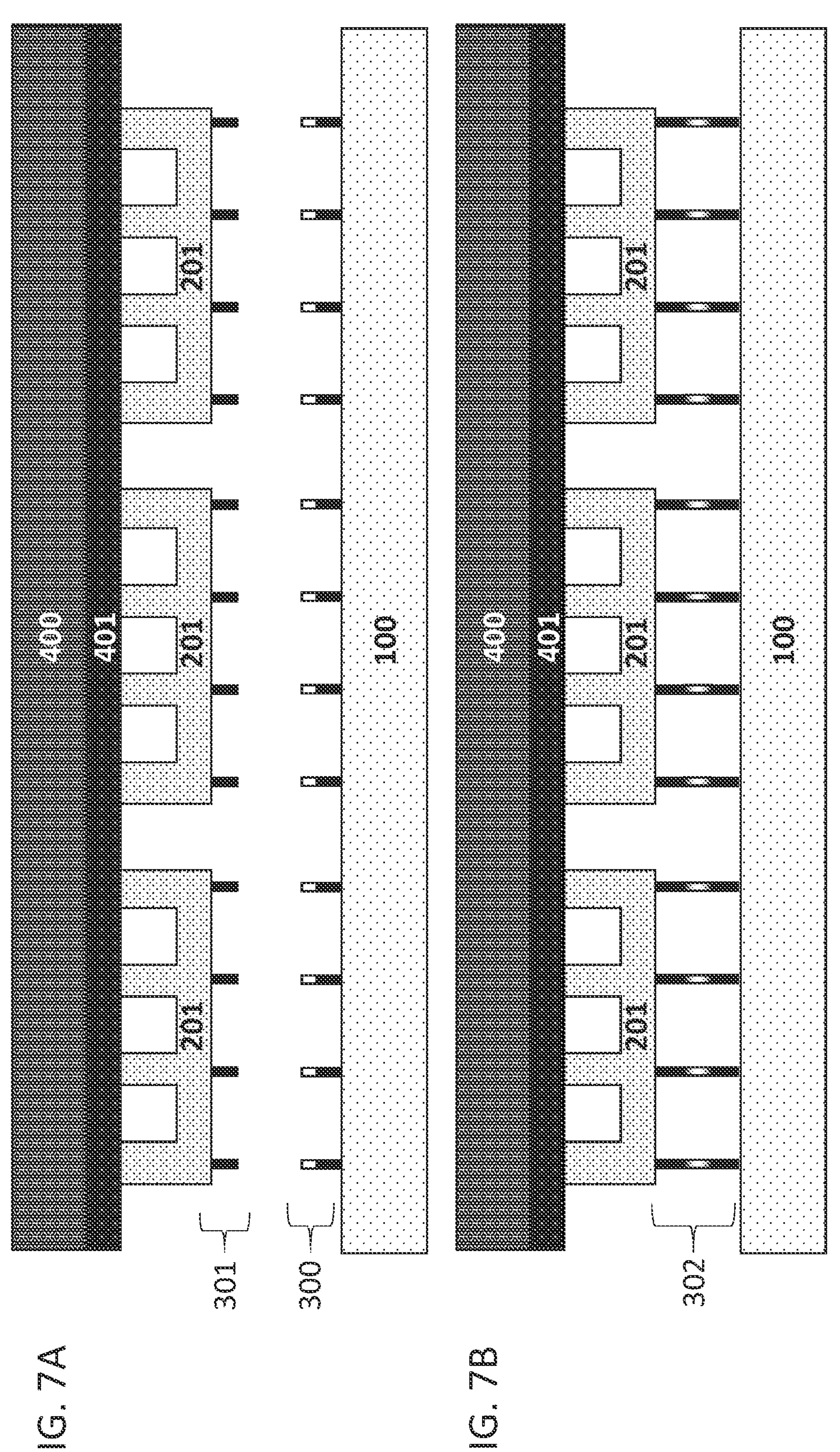
FIGS. 7A, 7B, 7C, and 7D illustrate die-to-wafer bonding using the SLID process, in accordance with disclosed embodiments.
Figures 7C, 7D:
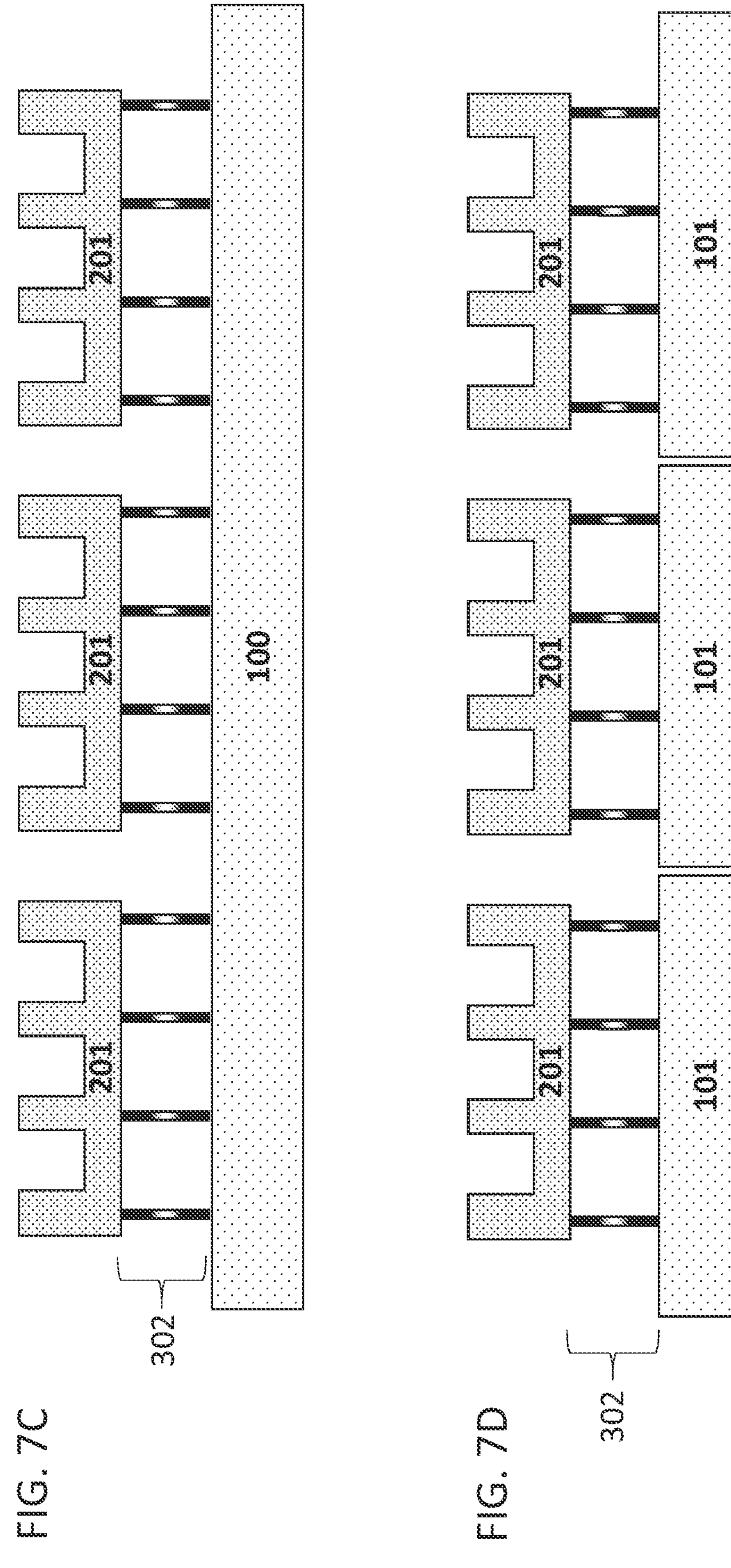
Figures 8A, 8B:
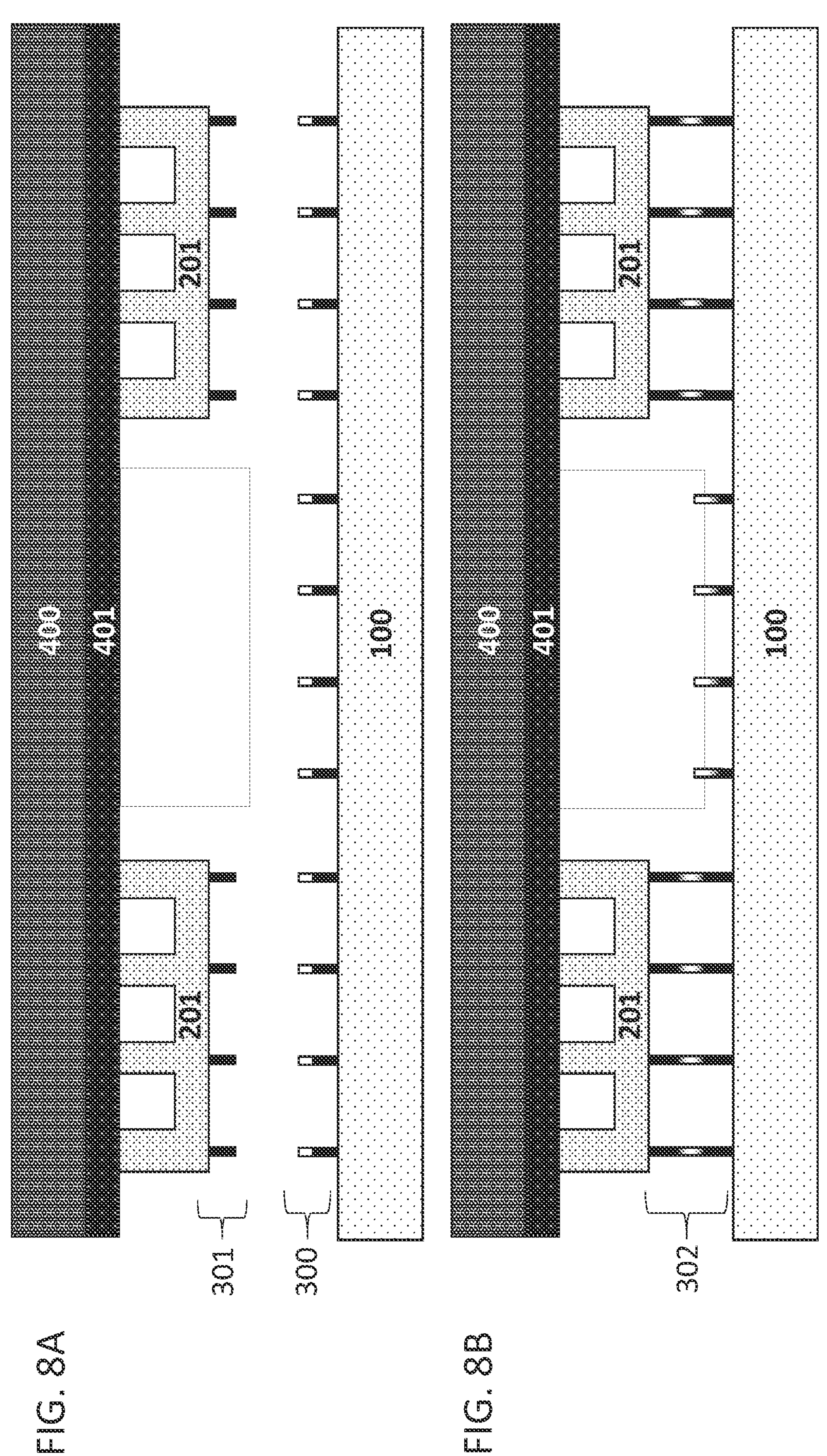
FIGS. 8A, 8B, 8C, and 8D illustrate die-to-wafer bonding with only known good dice (KGD) using a SLID process, in accordance with disclosed embodiments.
Figures 8C, 8D:
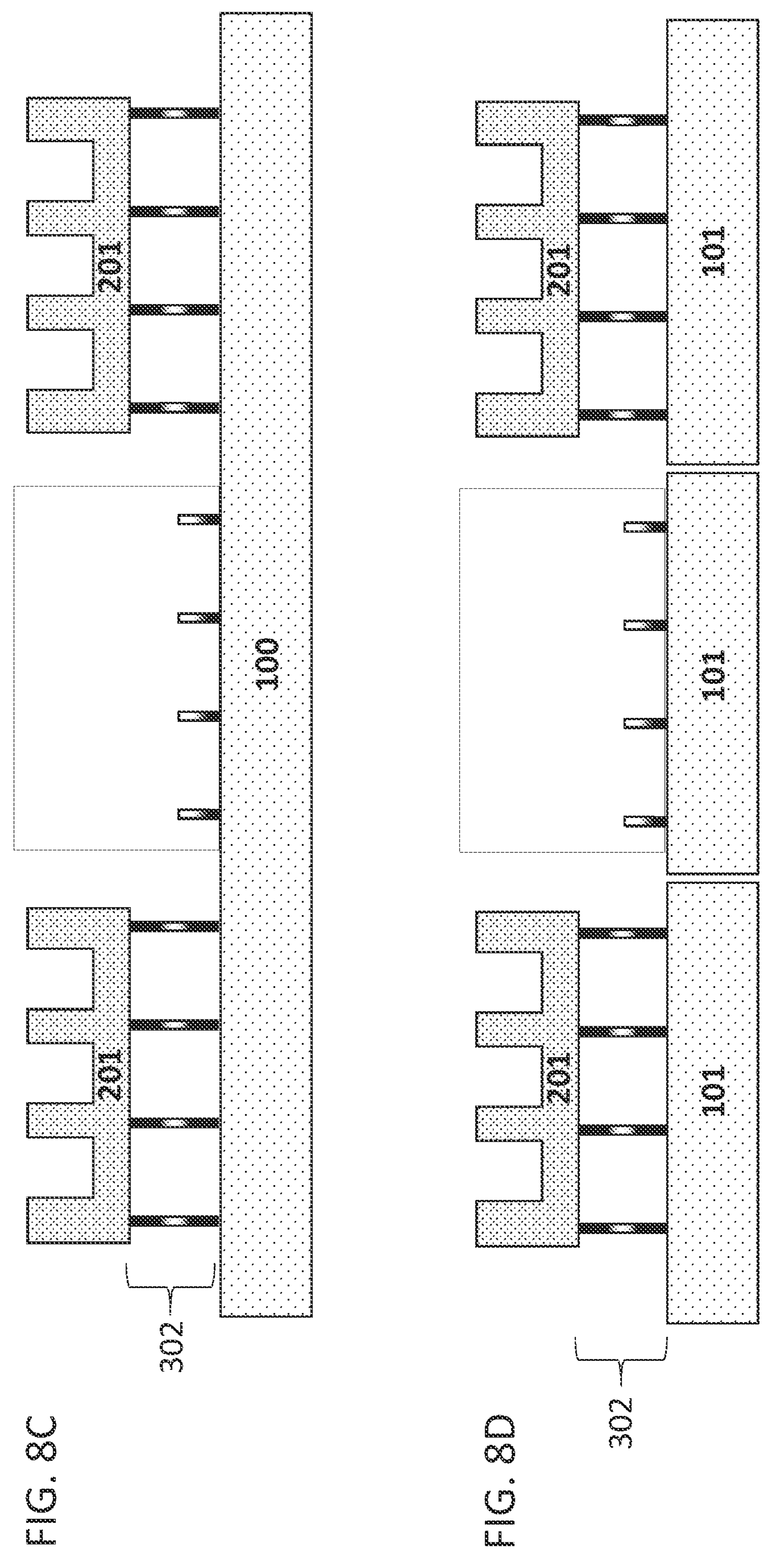

After the solid conductive bonds are formed between the two wafers, the handle substrate (400) and temporary bonding layer (401) are removed, as illustrated in the cross-section views from FIGS. 7B and 7C. The wafer stack can then be further processed as needed. For example, either or both of the pMUT dice (201) or the ASIC wafer (100) can be further thinned if desired. After the solid conductive bonds are formed between the two wafers, the ASIC wafer (100) is singulated to produce a plurality of ASIC dice (101), as illustrated in the cross-section views from FIGS. 7C to 7D, thereby completing the bonding process and obtaining the desired bonded configuration illustrated in FIG. 1.

It will be appreciated that one of skill in the art can use alternatives to the metal configurations for the bond. For example, $M_H$ and $M_L$ may be applied to the pMUT wafer (200), and/or only $M_H$ may be applied to the ASIC wafer (100). Further, the specific thicknesses of $M_H$ and $M_L$ can be adjusted, as long as the SLID process for the specific metal system is allowed to reach equilibrium with the available metal volumes. Because $M_L$ may be liquefied, its thickness can be adjusted to overcome any variations in height from the pillars and/or the wafers.

The method for die-to-wafer bonding may present an advantage of offering an ability to have different sizes of the ASIC dice and the pMUT dice. Further, the method for die-to-wafer bonding using SLID can overcome disparate stresses in the substrates due to CTE mismatches. In addition, the spacing between dice on the handle wafer (as illustrated in FIGS. 7A and 7B) and the malleability of the temporary bonding layer (401) may allow the dice to adjust their positions as the substrates expand at different rates during the heating process, thereby reducing or eliminating any run-in or run-out alignment errors.

FIGS. 8A, 8B, 8C, and 8D illustrate die-to-wafer bonding with only known good dice (KGD) using a SLID process, in accordance with disclosed embodiments. The method for die-to-wafer bonding may present an advantage of offering an ability to bond only known good dice (KGD), thereby reducing or eliminating challenges related to yield compounding between the ASIC dice (101) and the pMUT dice (201). This can be performed by placing only KGD pMUT dice (201) onto the handle wafer over KGD ASIC dice (101), as shown in FIGS. 8A to 8D.

The method for die-to-wafer bonding using SLID may also present potential challenges, such as a need for precise handling of thinned dice when attaching them to the handle wafer, and a need for precise pick-and-place equipment for this process. Such constraints may limit throughput of the method for die-to-wafer bonding, thereby resulting in increased manufacturing costs.

Diced Wafer-to-Wafer Bonding Using SLID

Figures 9A, 9B, 9C:
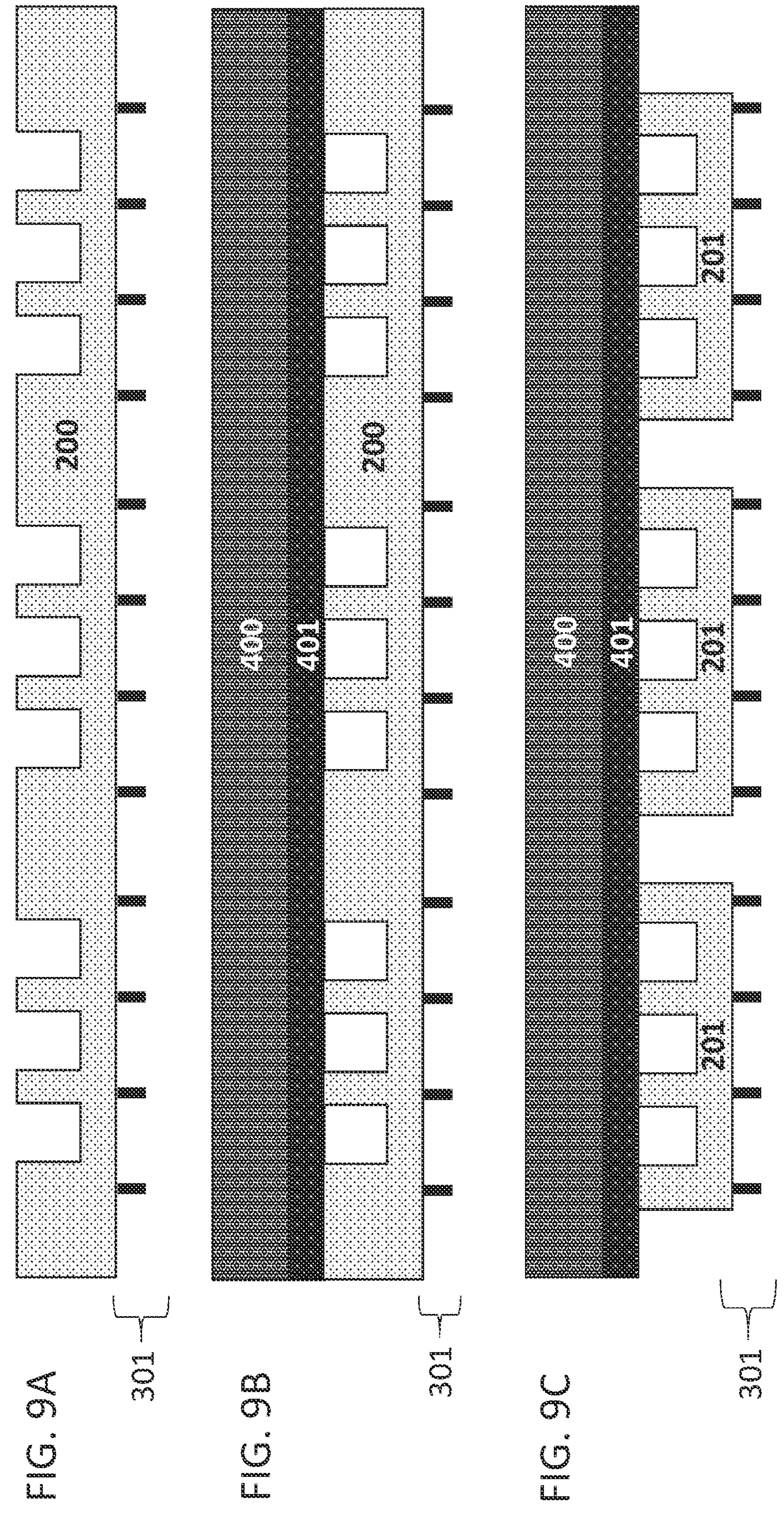
FIGS. 9A, 9B, and 9C illustrate preparation, mounting, and singulation of pMUT arrays on a handle substrate, in accordance with disclosed embodiments.

In an embodiment, the bonding may comprise a method for diced wafer-to-wafer bonding using SLID. FIGS. 9A, 9B, and 9C illustrate preparation, mounting, and singulation of pMUT arrays on a handle substrate, in accordance with disclosed embodiments. The method for diced wafer-to-wafer bonding may advantageously combine the high-throughput advantage of the method for wafer-to-wafer bonding with the stress-relieving capability of the method for die-to-wafer bonding. In addition, the method for diced wafer-to-wafer bonding may advantageously avoid a need for pick-and-place equipment. To accomplish this, the thinned pMUT wafer (200) is attached to a handle substrate (400) with a temporary bonding layer (401), as shown from FIG. 9*a* to FIG. 9*b*. The pMUT wafer is then singulated to produce a plurality of pMUT dice (201) by using a standard dicing saw to dice into the temporary bonding layer (401), as illustrated in the cross-section views from FIGS. 9B to 9C.

After singulating the pMUT wafer to produce the plurality of pMUT dice (201), the method for diced wafer-to-wafer bonding using SLID may comprise preparing the ASIC wafer (100) as described in FIGS. 2A, 2B, and 2C. A set of one or more conductive bond pillars (300) may be deposited and patterned on the ASIC wafer (100) or plated using a mold such as a photoresist. After the conductive bond pillars are formed, the ASIC substrate can be thinned as needed. The ASIC wafer (100) and the plurality of pMUT dice (201) with handle substrate (400) and temporary bonding layer (401) are aligned together, the fabrication atmosphere conditions (e.g., gases, temperature, and/or pressure) are adjusted as necessary, and the wafers are brought into contact. To form a sufficient intimate contact to promote bonding, pressure is applied to the contacting wafers. The wafers are brought up to a temperature suitable for the conductive bond pillars (300) and the conductive receiver pads or pillars (301) to form solid conductive bonds (300) using the SLID process, as illustrated in the cross-section views from FIGS. 7A and 7B.

After the solid conductive bonds are formed between the two wafers, the handle substrate (400) and temporary bonding layer (401) are removed, as illustrated in the cross-section views from FIGS. 7B and 7C. The wafer stack can then be further processed as needed. For example, either or both of the pMUT dice (201) or the ASIC wafer (100) can be further thinned if desired. After the solid conductive bonds are formed between the two wafers, the ASIC wafer (100) is singulated to produce a plurality of ASIC dice (101), as illustrated in the cross-section views from FIGS. 7C to 7D, thereby completing the bonding process and obtaining the desired bonded configuration illustrated in FIG. 1.

It will be appreciated that one of skill in the art can use alternatives to the metal configurations for the bond. For example, $M_H$ and $M_L$ may be applied to the pMUT wafer (200), and/or only $M_H$ may be applied to the ASIC wafer (100). Further, the specific thicknesses of $M_H$ and $M_L$ can be adjusted, as long as the SLID process for the specific metal system is allowed to reach equilibrium with the available metal volumes. Because $M_L$ may be liquefied, its thickness can be adjusted to overcome any variations in height from the pillars and/or the wafers.

The method for diced wafer-to-wafer bonding using SLID may present an advantage of offering an ability to rapidly bond a large number of components, while minimizing extra processing steps, similar to the method for wafer-to-wafer bonding using SLID. Such manufacturing advantages can be critical for high volume and/or low cost. Further, the method for diced wafer-to-wafer bonding using SLID may present an advantage that the addition of the handle substrate (400) and temporary bonding layer (401) can overcome any alignment errors due to CTE mismatches. The method for diced wafer-to-wafer bonding using SLID may also present potential challenges, such as 1) compounding of ASIC and pMUT yields, and 2) a need for the ASIC and pMUT wafers to be designed to match each another exactly.

Die-to-Die Bonding Using SLID

Figures 10A, 10B:
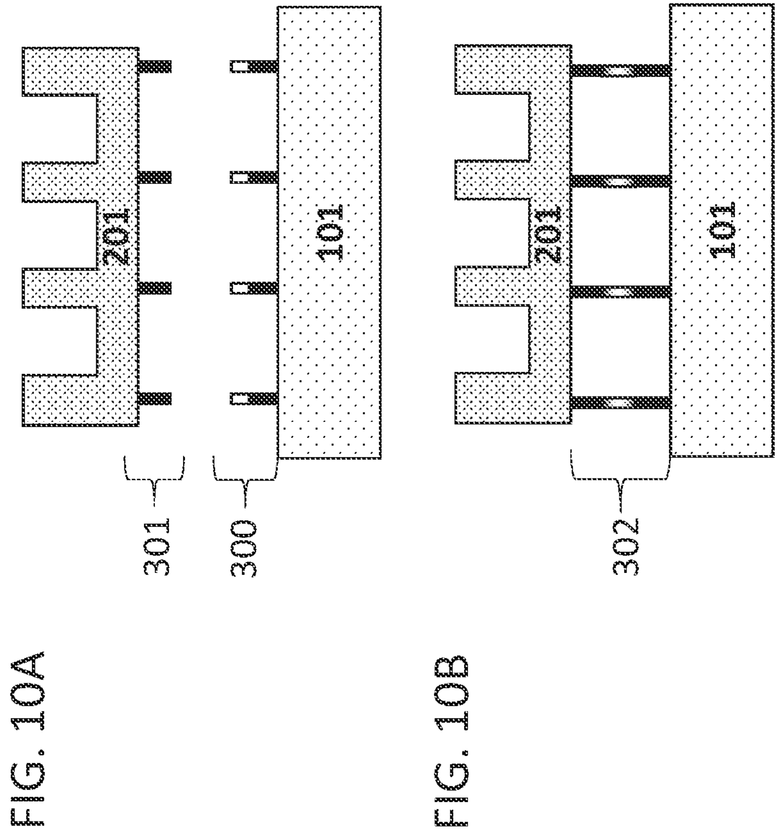
FIGS. 10A and 10B illustrate die-to-die bonding using a SLID process, in accordance with disclosed embodiments.

In an embodiment, the bonding may comprise a method for die-to-die bonding using SLID. FIGS. 10A and 10B illustrate die-to-die bonding using a SLID process, in accordance with disclosed embodiments. The method for die-to-die bonding using SLID may comprise preparing the ASIC wafer (100) as described in FIGS. 2A, 2B, and 2C. A set of one or more conductive bond pillars (300) may be deposited and patterned on the ASIC wafer (100) or plated using a mold such as a photoresist. After the conductive bond pillars are formed, the ASIC substrate can be thinned as needed. For example, a backside thinning process may be used to thin the backside of the ASIC wafer (100) to a desired thickness.

The method for die-to-die bonding using SLID may comprise preparing the pMUT wafer (200) as described in FIGS. 3A, 3B, and 3C. A set of one or more conductive receiver pads or pillars (301) are deposited and patterned on a pMUT wafer (200) or plated using a mold such as a photoresist. The conductive receiver pads or pillars (301) can have any suitable height and array configuration. The conductive receiver pads or pillars (301) can be formed at the time the pMUT wafer is fabricated. After the conductive receiver pads or pillars (301) are formed, the substrate can be thinned as needed, as illustrated in the cross-section views from FIGS. 3B to 3C. For example, a backside thinning process may be used to thin the backside of the pMUT wafer (200) to a desired thickness. The conductive receiver pads or pillars (301) may be formed only by the high-melting temperature metal, $M_H$ (e.g., Cu, Au, Ag, or Ni). Alternatively, the conductive receiver pads or pillars (301) may be formed by the high melting metal, $M_H$, capped by the low melting temperature metal, $M_L$ (e.g., Sn or In). In some embodiments, the conductive receiver pads or pillars (301) may be formed from only the low melting temperature metal, $M_L$.

After forming the conductive bond pillars on the ASIC wafer and forming the conductive receiver pillars or pads on the pMUT wafer, the ASIC wafer and the pMUT wafer may be separately singulated to produce a plurality of ASIC dice (101) with conductive bond pillars (300) and a plurality of pMUT dice (201) with conductive receiver pads or pillars (301), respectively. After singulating the ASIC wafer and the pMUT wafer, the plurality of ASIC dice (101) and the plurality of pMUT dice (201) are aligned together, the fabrication atmosphere conditions (e.g., gases, temperature, and/or pressure) are adjusted as necessary, and the dice are brought into contact. To form a sufficient intimate contact to promote bonding, pressure is applied to the contacting ASIC and pMUT dice. The ASIC dice (101) and pMUT dice (201) are brought up to a temperature suitable for the conductive bond pillars (300) and the conductive receiver pads or pillars (301) to form solid conductive bonds (300) using the SLID process, as illustrated in the cross-section views from FIGS. 10A and 10B, thereby completing the method for die-to-die bonding and obtaining the desired bonded configuration illustrated in FIG. 1.

It will be appreciated that one of skill in the art can use alternatives to the metal configurations for the bond. For example, $M_H$ and $M_L$ may be applied to the pMUT wafer (200), and/or only $M_H$ may be applied to the ASIC wafer (100). Further, the specific thicknesses of $M_H$ and $M_L$ can be adjusted, as long as the SLID process for the specific metal system is allowed to reach equilibrium with the available metal volumes. Because $M_L$ may be liquefied, its thickness can be adjusted to overcome any variations in height from the pillars and/or the wafers.

The method for die-to-die bonding may present an advantage of offering an ability to have different sizes of the ASIC dice and the pMUT dice. Further, similar to the method for die-to-wafer bonding with SLID and the method for diced wafer-to-wafer bonding with SLID, the method for die-to-die bonding using SLID can overcome disparate stresses in the substrates due to CTE mismatches because, instead of large wafers, only dice are bonded, thereby limiting the alignment errors which scale with the size of the substrates being aligned.

Further, similar to the method for die-to-wafer bonding using SLID, the method for die-to-die bonding may present an advantage of offering an ability to bond only known good dice (KGD), thereby reducing or eliminating challenges related to yield compounding between the ASIC dice (101) and the pMUT dice (201). This can be performed by bonding together only KGD ASIC dice (101) and KGD pMUT dice (201).

The method for die-to-die bonding using SLID may also present potential challenges, such as a need for precise handling of thinned dice when bonding, and a need for a die-to-die bonder equipment for this process. In addition, only one pair of ASIC and pMUT dice can be bonded at a time. Such constraints may limit throughput of the method for die-to-die bonding using SLID, thereby resulting in increased manufacturing costs.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A device comprising at least one first substrate and a second substrate, the first substrate comprising a piezoelectric micromachined ultrasonic transducer (pMUT) device and the second substrate comprising at least one electrical circuit, wherein the first substrate and the second substrate are bonded together using a conductive bonding pillar and a conductive receiver pad, which conductive bonding pillar comprises a layered arrangement of a layer of a first metal or metal alloy between the second substrate and a layer of a second metal or metal alloy distinct from the first metal or metal alloy, and which conductive receiver pad comprises a layer of a third metal or metal alloy that is disposed on the first substrate and distinct from both the first metal or metal alloy and the second metal or metal alloy, wherein a melting temperature of the second metal or metal alloy is (i) less than a melting temperature of the first metal or metal alloy and (ii) less than a melting temperature of the third metal or metal alloy, and wherein the conductive bonding pillar is connected to the conductive receiver pad with the second metal or metal alloy being in contact with the third metal or metal alloy to form one or more solid liquid interdiffusion (SLID) bonds in a SLID bonding process between the second metal or metal alloy and the third metal or metal alloy, wherein the bonding comprises die-to-wafer bonding a plurality of singulated first substrates, each comprising a pMUT device, to the second substrate.

2. The device according to claim 1, wherein the bonding is performed at a temperature less than a melting temperature of the conductive bonding pillar after the bonding.

3. The device according to claim 1, wherein the pMUT device is configured to perform ultrasound imaging.

4. The device according to claim 1, wherein the die-to-wafer bonding uses an intermediate handle substrate and a temporary bonding layer.

5. The device according to claim 4, wherein the bonding comprises:

(a) temporarily bonding a wafer of the first substrate to the handle substrate using the temporary bonding layer;

(b) dicing the wafer on the handle substrate; and (c) bonding the diced wafer to another wafer of the second substrate using solid liquid interdiffusion (SLID).

6. The device according to claim 1, wherein the bonding forms a hermetic sealed cavity, which cavity is configured to controllably maintain gas species and pressure.

7. The device according to claim 1, wherein the conductive bonding pillar has a height of at least 3 μm.

8. The device according to claim 1, wherein the conductive bonding pillar has a lateral dimension between 10 μm and 100 μm.

9. The device according to claim 1, wherein the SLID bonding is performed at a temperature of no more than 300° C.

10. The device according to claim 1, wherein the SLID bonding comprises bonding together a plurality of different metals or metal alloys selected from the group consisting of silver (Ag), gold (Au), copper (Cu), indium (In), nickel (Ni), tin (Sn), Cu-Sn, Au-Sn, Au-In, Au-In-Ni, and Ni-Sn.

11. The device according to claim 1, wherein one or more resultant intermetallic compounds are formed in the one or more solid liquid interdiffusion (SLID) bonds.

12. The device according to claim 1, wherein two or more resultant intermetallic compounds are formed in the one or more solid liquid interdiffusion (SLID) bonds.

13. The device according to claim 1, wherein the conductive bonding pillar further comprises a fourth metal or metal alloy, distinct from the first metal or metal alloy, the second metal or metal alloy, and the third metal or metal alloy, disposed between the second substrate and the first metal or metal alloy.

14. The device according to claim 1, wherein the second metal or metal alloy is a metal and is Sn, and wherein the third metal or metal alloy is a metal and is Au.

15. The method according to claim 1, wherein the first substrate comprising the pMUT is a known good die (KGD).

16. The method according to claim 1, wherein the first substrate and the second substrate have mismatched coefficients of thermal expansion (CTE).

17. A method of fabricating an integrated device, the method comprising:

(a) obtaining at least one first substrate comprising a piezoelectric micromachined ultrasonic transducer (pMUT) device;

(b) obtaining a second substrate comprising at least one electrical circuit; and (c) bonding together the first substrate and the second substrate using at least one conductive bonding pillar and at least one conductive receiver pad, which at least one conductive bonding pillar is disposed on the second substrate and comprises a layered arrangement of a layer of a first metal or metal alloy between the second substrate and a layer of a second metal or metal alloy, wherein the second metal or metal alloy is distinct from the first metal or metal alloy and has a melting temperature that is lower than a melting temperature of the first metal or metal alloy, and which at least one conductive receiver pad is disposed on the first substrate and comprises a layer of a third metal or metal alloy that is disposed on the first substrate and distinct from both the first metal or metal alloy and the second metal or metal alloy, wherein the conductive bonding pillar is connected to the conductive receiver pad with the second metal or metal alloy being in contact with the third metal or metal alloy to form one or more solid liquid interdiffusion (SLID) bonds are by a SLID bonding process between the second metal or metal alloy and the third metal or metal alloy, wherein the bonding comprises die-to-wafer bonding a plurality of singulated first substrates, each comprising a pMUT device, to the second substrate.

18. The method of claim 17, wherein the bonding is performed at a temperature less than the melting temperature of the conductive bonding pillar after the bonding.

19. The method according to claim 17, wherein the pMUT device is configured to perform ultrasound imaging.

20. The method according to claim 17, wherein the die-to-wafer bonding uses an intermediate handle substrate and a temporary bonding layer.

21. The method according to claim 20, wherein the bonding comprises:

(a) temporarily bonding a wafer of the first substrate to the handle substrate using the temporary bonding layer;

(b) dicing the wafer on the handle substrate; and (c) bonding the diced wafer to another wafer of the second substrate using solid liquid interdiffusion (SLID).

22. The method according to claim 21, wherein the method further comprises:

(a) aligning the diced wafer to the other wafer of the second substrate;

(b) adjusting atmospheric conditions;

(c) applying pressure to establish contact between the diced wafer and the other wafer; and (d) raising the temperature to form one or more SLID bonds.

23. The method according to claim 21, wherein the method further comprises (a) removing the handle substrate and the temporary bonding layer;

(b) dicing the other wafer of the second substrate; and (c) producing individual die of the first substrate bonded to individual die of the second substrate.

24. The method according to claim 21, wherein the method further comprises thinning the first substrate or the second substrate.

25. The method according to claim 17, wherein the bonding forms a hermetic sealed cavity, which cavity is configured to controllably maintain gas species and pressure.

26. The method according to claim 17, wherein the conductive bonding pillar has a height of at least 3 μm.

27. The method according to claim 17, wherein the conductive bonding pillar has a lateral dimension between 10 μm and 100 μm.

28. The method according to claim 17, wherein the SLID bonding process is performed at a temperature of no more than 300° C.

29. The method according to claim 17, wherein the SLID bonding comprises bonding together a plurality of different metals or metal alloys selected from the group consisting of silver (Ag), gold (Au), copper (Cu), indium (In), nickel (Ni), tin (Sn), Cu-Sn, Au-Sn, Au-In, Au-In-Ni, and Ni-Sn.

30. The method of claim 17, wherein the one or more SLID bonds connect the conductive bonding pillar and the conductive receiver pad in a conductive bond that comprises a single layer of a new alloy formed during creation of the SLID bond.

31. The method of claim 17, wherein the bonding together the first substrate and the second substrate uses at least a first conductive bonding pillar and a second conductive bonding pillar and at least a first conductive receiver pad and a second conductive receiver pad, and wherein a first SLID bond is formed between the first conductive bonding pillar and the first conductive receiver pad and a second SLID bond is formed between the second conductive bonding pillar and the second conductive receiver pad.

* * * * *